United States Patent [19]
Horwitz

[11] Patent Number: 4,462,882
[45] Date of Patent: Jul. 31, 1984

[54] SELECTIVE ETCHING OF ALUMINUM
[75] Inventor: Christopher M. Horwitz, Summer Hill, Australia
[73] Assignee: Massachusetts Institute of Technology, Cambridge, Mass.
[21] Appl. No.: 454,946
[22] Filed: Jan. 3, 1983
[51] Int. Cl.$^3$ .............................................. C03C 15/00
[52] U.S. Cl. ................................ 204/192 E; 156/643; 204/192 EC
[58] Field of Search ................... 204/192 E, 192 EC; 156/643

[56] References Cited
U.S. PATENT DOCUMENTS

| | | | |
|---|---|---|---|
| 4,303,467 | 12/1981 | Scornavacca | 204/192 E |
| 4,360,414 | 11/1982 | Beinvogl | 204/192 E |
| 4,361,599 | 11/1982 | Wourms | 204/192 E |
| 4,364,793 | 12/1982 | Graves | 204/192 E |
| 4,370,196 | 1/1983 | Vossen | 204/192 E |
| 4,373,990 | 2/1983 | Porter | 204/192 E |

Primary Examiner—Arthur P. Demers
Attorney, Agent, or Firm—Arthur A. Smith, Jr.; Thomas J. Engellenner

[57] ABSTRACT

A process for selectively etching an aluminum-containing coating in preference to a masking material on a surface of the aluminum-containing coating by positioning a patterned masking material on the aluminum-containing coating in a radio frequency plasma etching chamber and introducing an etchant gas and a source of oxygen and silicon to the interior of the chamber under conditions where silicon dioxide is deposited selectively on masking material layer while the unmasked aluminum-containing coating is etched.

4 Claims, 3 Drawing Figures

SELECTIVE ETCHING OF ALUMINUM

TECHNICAL FIELD

This invention relates to integrated circuit fabrication and, in particular, to aluminum and aluminum alloy etching.

BACKGROUND OF THE INVENTION

Attention is directed to my co-pending patent application entitled "Process for Selectively Etching Silicon" filed May 25, 1982, herein incorporated by reference.

Aluminum and alloys of aluminum with silicon and/or copper are widely used in integrated circuit metallization, and consequently a great deal of effort has been expended on dry etch processes which will enable fine Al patterns to be formed. The general approach which has been adopted is reactive sputter etching using an etch gas that reacts with Al to form a volatile reaction product when it is excited by an rf discharge.

For an example of the reactive sputter etching technique, see U.S. Pat. No. 3,994,793 issued to Harvilchuck on Nov. 30, 1976. Unfortunately, the only easily volatile Al compound is $AlCl_3$, and the requisite Cl in the discharge is exceptionally reactive with bare (unoxidized) Al. This reactivity results in loading effects and in lateral etching under the mask. In addition, the $AlCl_3$ residues are hygroscopic and form HCl upon air exposure which further attacks the metal. In contrast the native $Al_2O_3$ oxide layer is typically etched very slowly in Cl discharges, leading to long etch "initiation" times and to grain boundary images which propagate into the substrate.

Reactive sputter etching of Al thus has problems which are mainly related to the high reactivity of $Cl_2$ with Al. One remedy which has been proposed is to etch the Al patterns using nonreactive sputter etching or ion milling. However, these processes redeposit the etched metal on mask sidewalls, and have poor etch rate selectivity between materials. In addition, mask profiles are altered by "faceting", and substrates are anomalously etched near metal lines ("trenching").

It should be noted that a variety of ionic species have been used in reactive sputter etching of semiconductor materials (as opposed to aluminum or aluminum alloys). Considerable efforts have been made to develop selective etching techniques for semiconductors that can, for example, etch silicon dioxide more rapidly than silicon or, conversely, remove silicon from a surface faster than $SiO_2$. See, for example, U.S. Pat. No. 4,213,813 issued to Lemons on July 22, 1980, wherein additives such as $O_2$ are proposed to achieve selective etching. I am not aware of any prior teachings of the use of such additives in connection with aluminum etching.

There exists a need for selective etching techniques for aluminum that would permit the formation of fine Al patterns. Additionally there exists a need for new etchants that are more controllable and less corrosive than chlorine-based aluminum etches.

SUMMARY OF THE INVENTION

A new technique for sputter etching of Al is described which can pattern fine lines in Al or in Al-Cu-Si alloy but does not have many of the problems associated with presently available reactive sputter etching methods. The technique combines deposition and etching in the one process; $Al_2O_3$, Al, and Al-Cu-Si alloy are etched, while all other materials are coated with a layer of $SiO_x$. This results in essentially infinite (Al/mask) and (Al/substrate) etch rate ratios. In addition, the etch gas contains no Cl, which is a common cause of corrosion and undercut.

The gas described here is a $SiF_4/O_2$ mixture, and it is shown that additions of most impurity gases have very little effect on the etch. Water or $H_2$ addition is, however, beneficial and typical profiles are shown for a $SiF_4/O_2/H_2$ mixture with Cr and photoresist masking layers. This etch "squares off" photoresist profiles, resulting in linewidth shrinkage by an amount dependent on the initial photoresist edge slope. The $SiO_x$ coating forms peaked structures on the masking layer and can be stripped after the sputtering process with selective wet etchants to expose the photoresist and the underlying Al pattern.

DETAILED DESCRIPTION OF THE PREFERRED EMBODIMENTS

Figure 1:
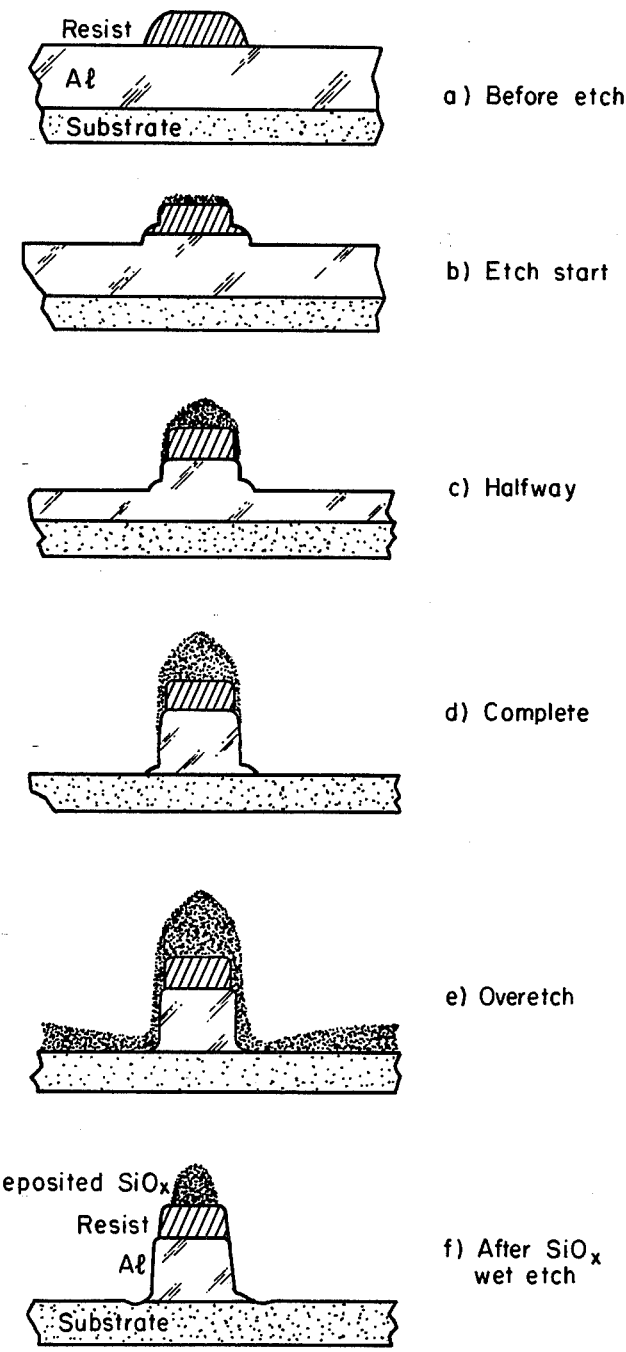
FIG. 1 is a schematic diagram of the steps in my aluminum etching method.

In FIG. 1 the process of my invention is shown schematically. In the first step a resist is deposited on an aluminum-coated substrate wherein an aluminum strip is ultimately desired. In the second step etching begins and proceeds until all the aluminum not covered by resist is removed. At the same time an $SiO_x$ coating is built-up on top of the resist-covered structures. After the uncovered Al is etched to completion, continuation coats the entire surface with $SiO_x$. The coating forms less easily adjacent to etched structures probably because of shadowing and "trenching" or "dovetailing" processes, which are caused by reflection of sputtering particles from a sloping sidewall to the surface below, resulting in an enhanced etch rate near the sidewall. Removal of the $SiO_x$ coating from the Al sidewall and from the substrate results in some attack of the substrate, and this attack will be most pronounced where the $SiO_x$ coating was thinnest. Hence, in cases where this attack is undesirable, the sputtering over-etch time should be limited. The $SiO_x$ coating is then removed by wet etching and after $SiO_x$ removal the photoresist is removed in a hot resist stripping solution.

A standard sputtering system was used in my experiments modified to accept a 10 cm-dia. Si target. In this configuration the dc bias voltage was ½ of the rf peak-to-peak voltage. Etch rates were measured from stylus traces over regions masked by small Si chips or by thin layers of the material to be measured. The etch rate of a patterned material was sometimes affected by the choice of substrate so, for consistency in FIGS. 2 and 3, results for Si substrates are given. All samples were contacted to the target using diffusion pump oil since substrate temperature affects both the etch and $SiO_x$ coating rates.

Figure 2:
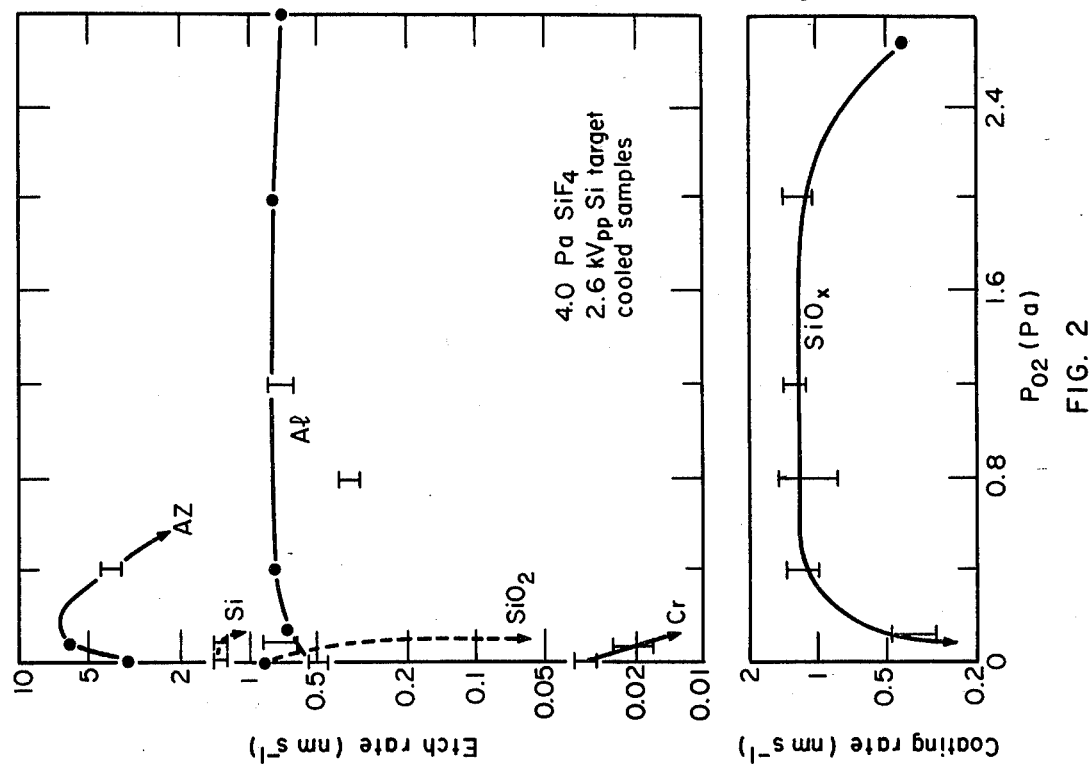
FIG. 2 is a graph of etching and coating rates versus partial pressure of $O_2$ in a high pressure $SiF_4$ discharge according to my invention.

FIG. 2 shows the dependence of etch and coating rates on $O_2$ partial pressure in a 4 Pa $SiF_4$ discharge. $O_2$ combines with Si from the discharge to form $SiO_x$, and three factors determine whether a surface will be coated: (a) the available $SiO_x$ generation rate in the discharge; (b) the probability of $SiO_x$ formation on the surface; and (c) the probability of the deposited $SiO_x$ being resputtered. The first factor is controlled partly by the $O_2$ partial pressure, since progressively more materials become coated as the $O_2$ partial pressure rises. Of course, all coated surfaces are alike and have the same coating rate: this rate appears to be controlled by factors (b) and (c). (The variability of this coating rate will be discussed later).

Figure 3:
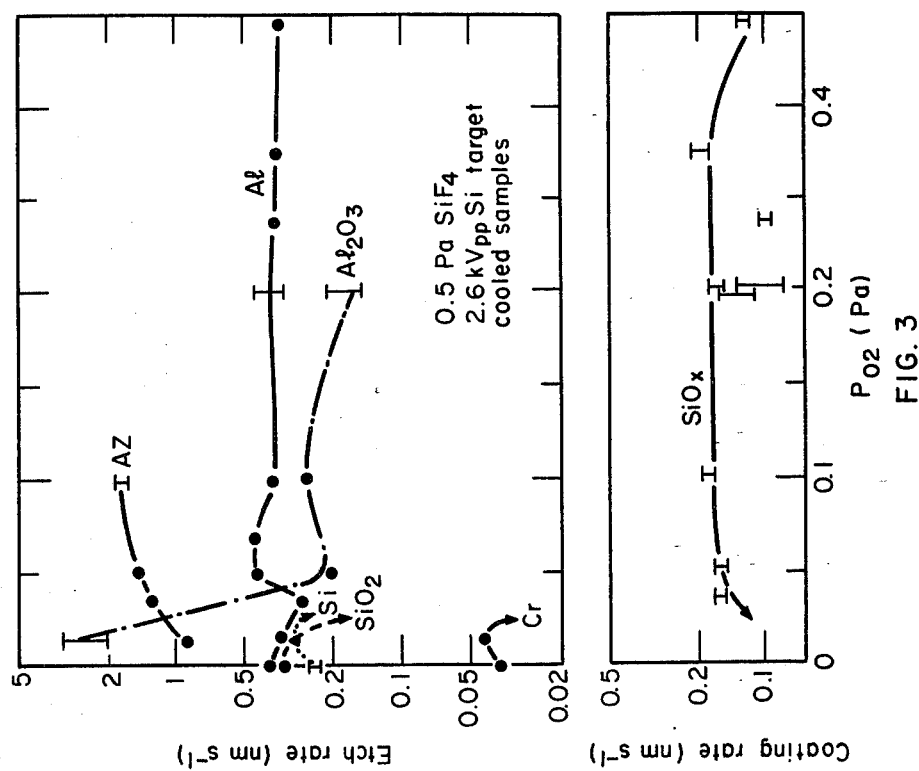
FIG. 3 is a graph of etching and coating rates versus partial pressure of $O_2$ in a low pressure $SiF_4$ discharge according to my invention.

Further studies were made at a lower $SiF_4$ gas flow rate (of 0.01 Pa $m^3 s^{-1}$) and 0.5 Pa $SiF_4$ pressure. FIG. 3 shows the variation of etching characteristics with $O_2$ partial pressure; these results are similar to those obtained at 4 Pa $SiF_4$ pressure. The effects of gas additions are shown in Table 1.

TABLE 1

Al etch and $SiO_x$ coating rates with various gases added to a 0.5 Pa $SiF_4$ discharge with Si target held at 2.6 $kV_{p-p}$.

| Conditions | $SiO_x$ Coating Rate (nm s$^{-1}$) | Al etch Rate (nm s$^{-1}$) |
|---|---|---|
| No additions | (Si was etched) | 0.4 |
| 0.25 Pa $O_2$, long pumpout | 0.012 | 0.37–0.44 |
| 0.25 Pa $O_2$, standard | 0.08–0.17 | 0.33–0.42 |
| 0.25 Pa $O_2$, 4° C. target | 0.02–0.22 | 0.4–0.48 |
| 0.15 Pa $H_2O$ | 0.65–0.7 | 0.29 |
| 0.25 Pa $O_2$, 0.25 Pa $H_2$ | 0.52–0.6 | 0.3–0.33 |
| 0.25 Pa $O_2$, 0.22 Pa $CHF_3$ | (Se was etched) | 0.38–0.48 |
| 0.25 Pa $O_2$, 0.08 Pa $N_2$ | 0.12 | 0.36 |
| 0.5 Pa CO | (slight coating) | 0.19 |
| 0.25 Pa $O_2$, 0.035 Pa He | 0.26–0.3 | 0.44 |

Note that with all gases but CO, the Al etch rate is roughly constant. However, the $SiO_x$ coating rate is strongly affected by $H_2$ and $H_2O$ additions. Variations in chamber pump-out time result in variations in the residual $H_2O$ level, and this is the probable cause of the observed coating rate variability. The mechanism of this $H_2$—$SiO_x$ interaction is not clear; HF may be formed thus liberating more free Si, or H may catalyse reactions in the discharge or on the surfaces.

The $SiO_x$ coating can be removed after sputter etching with any HF-containing solution. However, since the Al etch rate must be minimized to retain good line definition, the typical etch must have a high ($SiO_x$/Al) etch rate ratio. Buffered HF has a ratio of ~43, whereas the modified buffered HF solution available from Transene Corporation of Rowley, MA has a ratio of 500–650. The $SiO_x$ layer is etched rapidly in comparison with fused quartz, indicating high porosity.

What I claim is:

1. The process for selectively etching an aluminum-containing coating in preference to a masking material on a surface of said aluminum-containing coating which comprises coating a substrate with an aluminum-containing material, positioning a patterned masking material on said aluminum-containing coating, positioning said substrate on a target connected to a radio frequency electrode, introducing an etchant gas composition into said chamber under conditions to convert said etchant gas composition to a plasma, providing a source of oxygen and silicon to the interior of said chamber under conditions to deposit silicon dioxide selectively on said masking material layer and to etch said aluminum-containing coating not covered by said masking layer selectively.

2. The process of claim 1 wherein said masking material is a photoresist.

3. The process of claim 1 wherein said etchant gas is $SiF_4$ as a source of silicon.

4. The process of claim 1 wherein the process further comprises providing a source of hydrogen to interior of said chamber.

* * * * *